United States Patent
Mitra et al.

(10) Patent No.: US 12,176,918 B2
(45) Date of Patent: Dec. 24, 2024

(54) HYBRID LDPC DECODER WITH MIXED PRECISION COMPONENTS

(71) Applicant: Intel Corporation, Santa Clara, CA (US)

(72) Inventors: Debarnab Mitra, Los Angeles, CA (US); Santhosh K. Vanaparthy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 715 days.

(21) Appl. No.: 17/183,223

(22) Filed: Feb. 23, 2021

(65) Prior Publication Data

US 2021/0175901 A1    Jun. 10, 2021

(51) Int. Cl.
 *H03M 13/00* (2006.01)
 *G06F 11/10* (2006.01)
 *H03M 13/11* (2006.01)

(52) U.S. Cl.
 CPC ..... *H03M 13/1111* (2013.01); *G06F 11/1068* (2013.01); *H03M 13/1128* (2013.01)

(58) Field of Classification Search
 CPC ........... H03M 13/1111; H03M 13/1128; G06F 11/1068
 See application file for complete search history.

(56) References Cited

U.S. PATENT DOCUMENTS

| | | | | | |
|---|---|---|---|---|---|
| 5,822,463 | A * | 10/1998 | Yokose | ................ | H04N 19/149 375/E7.157 |
| 6,584,232 | B2 * | 6/2003 | Kobayashi | ........... | H04N 19/126 375/E7.176 |
| 6,664,913 | B1 * | 12/2003 | Craven | ............... | H03M 7/3046 375/243 |
| 6,904,404 | B1 * | 6/2005 | Norimatsu | ............ | G10L 19/038 704/222 |
| 8,166,363 | B2 * | 4/2012 | Shinya | ............... | H03M 13/1111 714/752 |
| 8,743,493 | B1 * | 6/2014 | Chang | .............. | G11B 20/10268 360/39 |
| 10,467,090 | B2 * | 11/2019 | Torii | ................. | H03M 13/2909 |
| 11,109,031 | B2 * | 8/2021 | Nishi | ................... | H04N 19/517 |
| 2010/0118945 | A1* | 5/2010 | Wada | ..................... | H04N 19/70 375/E7.246 |

OTHER PUBLICATIONS

"Tanner Graph—an overview", ScienceDirect, Jan. 18, 2021, 21 pgs.

Declercq, David et al., "Extended MinSum Algorithm for Decoding LDPC Codes over GF(q)", IEEE International Symposium on Information Theory, pp. 464-468, Sep. 2005.

(Continued)

*Primary Examiner* — Esaw T Abraham
(74) *Attorney, Agent, or Firm* — Essential Patents Group, LLP

(57) ABSTRACT

An embodiment of an electronic apparatus may comprise one or more substrates, and a decoder coupled to the one or more substrates, the decoder including logic to perform a first decode stage with a first fixed quantization width, and perform a second decode stage with a second fixed quantization width that is different from the first fixed quantization width. Other embodiments are disclosed and claimed.

17 Claims, 7 Drawing Sheets

(56) References Cited

OTHER PUBLICATIONS

Kim, Sangmin, "Improved Trellis-Based Decoder for Non-Binary LDPC Codes", IEEE International Conference on Computing, Networking and Communications (ICNC), pp. 1-5, Feb. 2016.
Li, Erbao et al., "Trellis-Based Extended Min-Sum Algorithm for Non-Binary LDPC Codes and its Hardware Structure", IEEE Transactions on Communications, vol. 61, No. 7, Jul. 2013, 12 pgs.
Savin, Valentin, "Self-Corrected Min-Sum decoding of LDPC codes", IEEE International Symposium on Information Theory, pp. 146-150, 2008.

* cited by examiner

HYBRID LDPC DECODER WITH MIXED PRECISION COMPONENTS

BACKGROUND

A low-density parity-check (LDPC) code refers to a linear error correcting code that may be applied to error-prone data, such as transmission of data over a noisy channel, storage of data in memory that is subject to defects in the media, etc. LDPC technology may involve construction of a particular type of bipartite graph referred to as a Tanner graph. Non-binary LDPC (NB-LDPC) may provide better decoding performance as compared to binary LDPC for moderate code lengths, but with higher complexity. An Extended Min-Sum (EMS) decoder may provide a NB-LDPC decoder that reduces the complexity of the check node processing unit compared to a non-binary belief propagation decoder by using limited number of values of the log-density ratio (LDR) messages. A Trellis-based Extended Min-Sum (TEMS) decoder may provide a NB-LDPC decoder that may be hardware implementable with lower decoding latency as compared to the EMS decoder by using a greater degree of hardware parallelization. An improved TEMS (ImprovedTEMS) decoder modifies the TEMS decoder to improve its raw bit error rate (RBER) performance using an alternate message update scheme during the check node processing.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
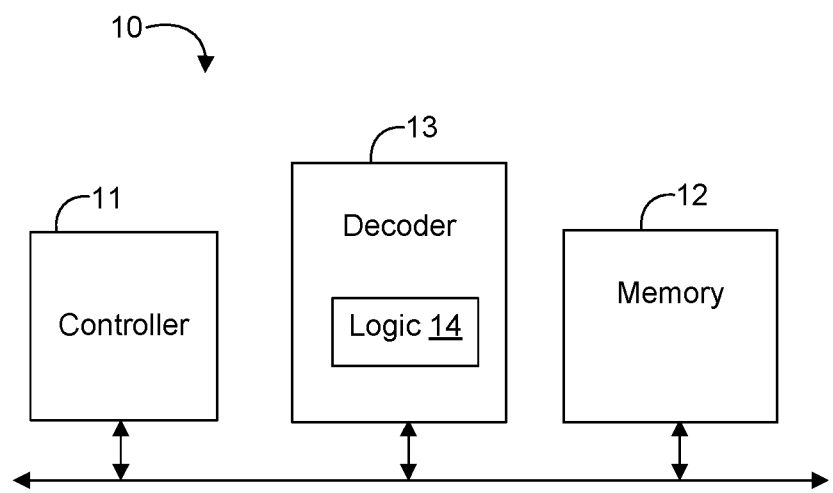
FIG. 1 is a block diagram of an example of an electronic system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; NV memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a three dimensional (3D) crosspoint memory device, or other byte addressable write-in-place nonvolatile memory devices. In one embodiment, the memory device may be or may include memory devices that use chalcogenide glass, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, or other suitable standard (the JEDEC standards cited herein are available at jedec.org).

With reference to FIG. 1, an embodiment of an electronic system 10 may include a controller 11, memory 12, and a decoder 13 communicatively coupled to the controller 11 and the memory 12. The decoder 13 may include logic 14 to perform a first decode stage with a first fixed quantization width, and perform a second decode stage with a second fixed quantization width that is different from the first fixed quantization width. For example, the first decode stage may correspond to a sum-stage of the decoder 13, the second decode stage may correspond to a min-stage in a delta domain of the decoder 13, and the first fixed quantization width may be greater than the second fixed quantization width.

In some embodiments, the logic 14 may be further configured to iteratively pass messages back and forth between check nodes and variable nodes, where a first number of bits allocated to messages sent from a variable node to a check node is greater than a second number of bits allocated to messages sent from a check node to a variable node. For example, the logic 14 may be configured to pad messages sent from the check nodes to the variable nodes to fit the first number of bits. In some embodiments, the logic 14 may be configured to perform a left shift to pad the messages sent from the check node to the variable node and preserve the most significant bits (MSBs) of the messages. The logic 14 may also be configured to truncate messages sent from the variable nodes to the check nodes to fit the second number of bits. For example, the logic 14 may be configured to perform a right shift to truncate the messages sent from the variable nodes to the check nodes and preserve the MSBs of the message.

Embodiments of each of the above controller 11, memory 12, decoder 13, logic 14, and other system components may be implemented in hardware, software, or any suitable combination thereof. For example, hardware implementations may include configurable logic such as, for example, programmable logic arrays (PLAs), FPGAs, complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the memory 12, the decoder 13, the logic 14, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as RAM, ROM, programmable ROM (PROM), firmware, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the memory 12, persistent storage media, or other system memory may store a set of instructions which when executed by the controller 11 cause the system 10 to implement one or more components, features, or aspects of the system 10 (e.g., the logic 14, performing the first decode stage of the decoder with the first fixed quantization width, performing the second decode stage of the decoder with the second fixed quantization width, etc.).

Figure 2:
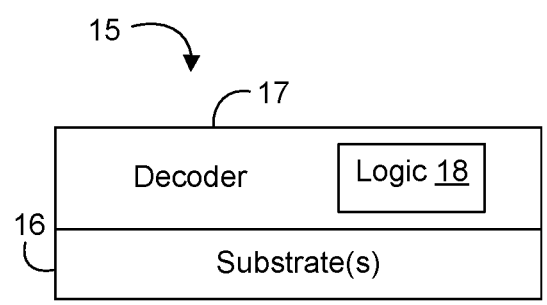
FIG. 2 is a block diagram of an example of an electronic apparatus according to an embodiment.

With reference to FIG. 2, an embodiment of an electronic apparatus 15 may include one or more substrates 16, and a decoder 17 coupled to the one or more substrates 16. The decoder 17 may include logic 18 to perform a first decode stage with a first fixed quantization width, and perform a second decode stage with a second fixed quantization width that is different from the first fixed quantization width. For example, the first decode stage may correspond to a sum-stage of the decoder 17, the second decode stage may correspond to a min-stage in a delta domain of the decoder 17, and the first fixed quantization width may be greater than the second fixed quantization width.

In some embodiments, the logic 18 may be further configured to iteratively pass messages back and forth between check nodes and variable nodes, where a first number of bits allocated to messages sent from a variable node to a check node is greater than a second number of bits allocated to messages sent from a check node to a variable node. For example, the logic 18 may be configured to pad messages sent from the check nodes to the variable nodes to fit the first number of bits. In some embodiments, the logic 18 may be configured to perform a left shift to pad the messages sent from the check node to the variable node and preserve the MSBs of the messages. The logic 18 may also be configured to truncate messages sent from the variable nodes to the check nodes to fit the second number of bits. For example, the logic 18 may be configured to perform a right shift to truncate the messages sent from the variable nodes to the check nodes and preserve the MSBs of the message.

Embodiments of the logic 18 may be implemented in a system, apparatus, computer, device, etc., for example, such as those described herein. For example, the logic 18 may be incorporated in a LDPC module as part of a memory system, a storage system, a transmission system, or any system or device where LDPC technology is beneficial. More particularly, hardware implementations of the logic 18 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 18 may be implemented in one or more modules as a set of logic instructions stored in a machine- or computer-readable storage medium such as RAM, ROM, PROM, firmware, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the logic 18 may be implemented on a semiconductor apparatus, which may include the one or more substrates 16, with the logic 18 coupled to the one or more substrates 16. In some embodiments, the logic 18 may be at least partly implemented in one or more of configurable logic and fixed-functionality hardware logic on semiconductor substrate(s) (e.g., silicon, sapphire, gallium-arsenide, etc.). For example, the logic 18 may include a transistor array and/or other integrated circuit components coupled to the substrate(s) 16 with transistor channel regions that are positioned within the substrate(s) 16. The interface between the logic 18 and the substrate(s) 16 may not be an abrupt junction. The logic 18 may also be considered to include an epitaxial layer that is grown on an initial wafer of the substrate(s) 16.

Figure 3:
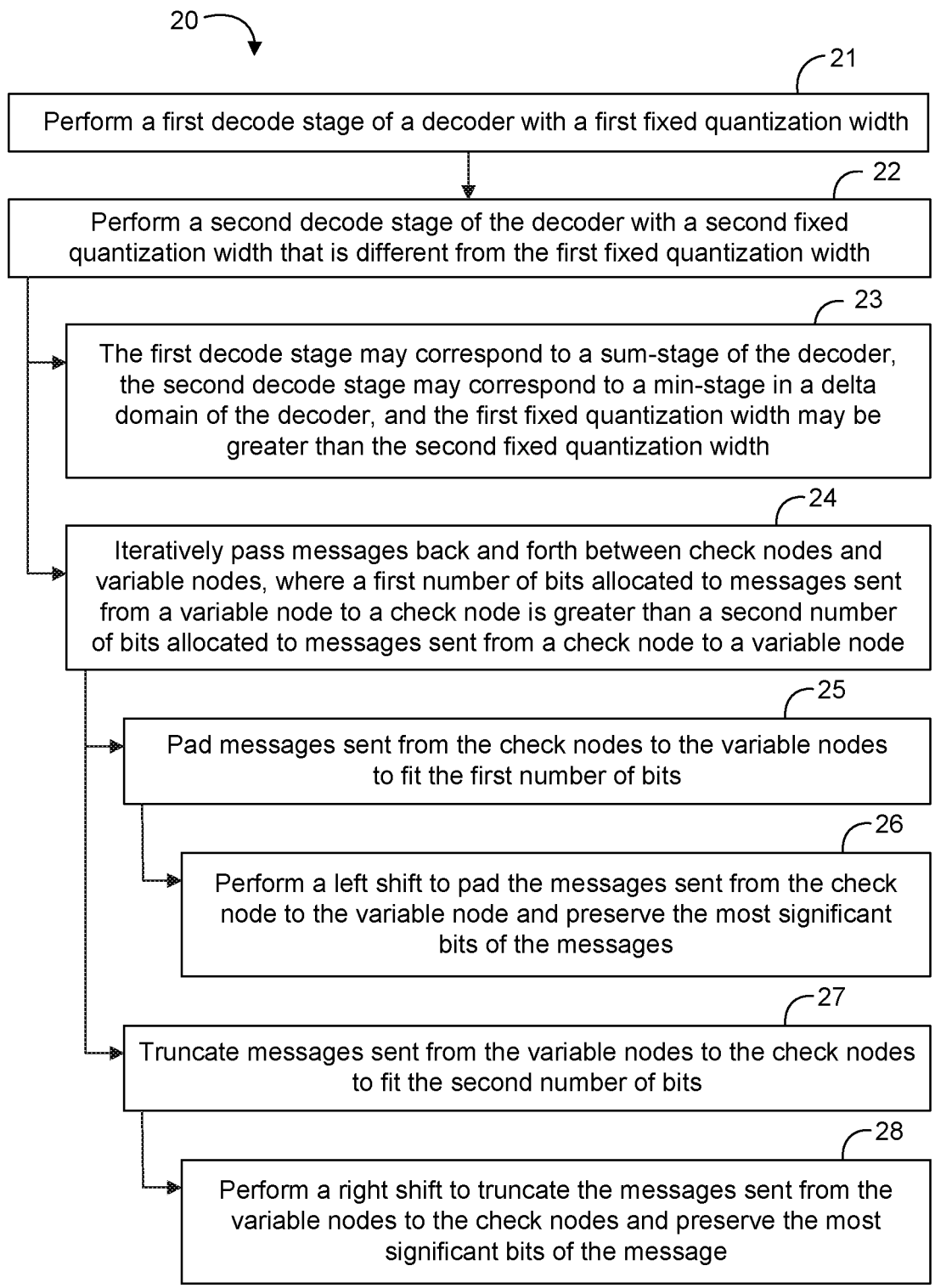
FIG. 3 is a flowchart of an example of a method of decoding parity information according to an embodiment.

Turning now to FIG. 3, an embodiment of a method 20 of decoding parity information may include performing a first decode stage of a decoder with a first fixed quantization width at block 21, and performing a second decode stage of the decoder with a second fixed quantization width that is different from the first fixed quantization width at block 22. For example, the first decode stage may correspond to a sum-stage of the decoder, the second decode stage may correspond to a min-stage in a delta domain of the decoder, and the first fixed quantization width may be greater than the second fixed quantization width at block 23.

Some embodiments of the method 20 may further include iteratively passing messages back and forth between check nodes and variable nodes at block 24, where a first number of bits allocated to messages sent from a variable node to a check node is greater than a second number of bits allocated to messages sent from a check node to a variable node. For example, the method 20 may include padding messages sent from the check nodes to the variable nodes to fit the first number of bits at block 25. In some embodiments, the method 20 may include performing a left shift to pad the messages sent from the check node to the variable node and preserve the MSBs of the messages at block 26. The method 20 may also include truncating message sent from the variable nodes to the check nodes to fit the second number of bits at block 27. For example, the method 20 may include performing a right shift to truncate the messages sent from the variable nodes to the check nodes and preserve the MSBs of the message at block 28.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Hybrid hardware implementations include static dynamic System-on-Chip (SoC) re-configurable devices such that control flow, and data paths implement logic for the functionality. Alternatively, or additionally, the method 20 may be implemented in one or more modules as a set of logic instructions stored in a machine- or computer-readable storage medium such as RAM, ROM, PROM, firmware, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the method 20 may be implemented on a computer readable medium. Embodiments or portions of the method 20 may be implemented in firmware, applications (e.g., through an application programming interface (API)), or driver software running on an OS. Additionally, logic instructions might include assembler instructions, instruction set architecture (ISA) instructions, data set architecture (DSA) commands, (machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, Moore Machine, Mealy Machine, etc.).

Some embodiments may advantageously provide technology for a hybrid decoder with mixed precision components that provide an improved tradeoff between hardware complexity and RBER performance for non-binary low-density parity-check (NB-LDPC) codes. NB-LDPC codes have superior error-correction performance compared to their binary counterparts at the cost of higher complexity of the decoding algorithm. This increased decoding complexity hinders the hardware implementation of NB-LDPC codes. The Trellis based Extended Min Sum (TEMS) decoder may reduce the decoding complexity, thus making practical hardware implementations feasible. However, in any finite precision implementation, the number of bits used to represent different numbers, also known as the quantization width, plays an important role in determining the hardware complexity of the decoder and the RBER-performance Using too few bits may lead to an unacceptable loss in RBER performance and using too many bits (e.g., to approximate a floating-point decoder) may lead to unacceptable hardware complexity, thus demonstrating a tradeoff between the two quantities.

Some embodiments may provide technology for a TEMS decoder with different finite precision components (e.g., having different quantization widths) that advantageously offer a better tradeoff between hardware complexity and RBER performance than conventional uniform precision decoders. Embodiments may also be utilized with binary LDPC decoders that propagate LLR messages during the decoding process (e.g., such as the Min-Sum decoder, etc.).

The TEMS decoder for NB-LDPC codes utilizes an iterative message passing technique where log-density ratio (LDR) messages are sent back and forth between check nodes (CNs) and variable nodes (VNs) in a Tanner graph. The technique involves several decoding stages such as pre-sum message computation in the normal domain, sum-stage, min-stage in the delta domain, etc. Embodiments provide technology for different decoding stages to utilize different quantization precision, advantageously improving the RBER performance with lower hardware complexity. In some implementations, the VN to CN (v2c) message are important to the decoding performance and the v2c messages computation involves summing all the incoming CN to VN (c2v) messages. Some embodiments allocate more bits to the v2c messages, as compared to other messages in the decoder. Moreover, when the messages are truncated to fit in the designed quantization width, the MSBs are kept. In some implementations, the operations involved in the c2v message calculation occur in a delta or a difference domain. Some embodiments provide the messages involved in the check node operations with fewer bits of quantization to reduce the hardware complexity. In some embodiments, left shift and right shift operations are utilized (e.g., instead of clipping) to move back and forth between different mixed precision components in order to preserve the MSBs of the variable(s), which may be of more importance to the operations involved in the decoder.

In some memory systems, the total power available to the media and the controller may be relatively fixed. Because controllers with larger hardware complexity have larger power requirements, the total power available to the media is reduced, which directly degrades the overall system performance. Advantageously, some embodiments provide technology to facilitate the design of memory controllers with superior error correction strength and simultaneously with reduced hardware complexity, thus requiring smaller power for the controller. Some embodiments may advantageously provide NB-LDPC technology for advanced memory systems such as INTEL OPTANE memory technology, etc., where faster error correction may be beneficial.

At moderate codeword lengths, NB-LDPC codes exhibit superior error correction capabilities compared to binary LDPC codes, at the cost of increased decoding complexity. The TEMS decoder may be suitable for practical implementation of a decoder in hardware, but a problem is that a fixed-point implementation of the decoder with a small quantization width to limit the hardware complexity leads to a significant RBER performance loss. In a conventional fixed point decoder, all messages are represented by the same quantization width where the same number of bits are used to represent messages in different decoding stages. For a conventional TEMS decoder, however, there are some messages where reducing the quantization width beyond a certain value results in significant degradation of decoding performance. For other messages, using smaller quantization width does not result in any performance loss. Some embodiments may provide a hybrid decoder that has components with different precisions. For an embodiment of a TEMS decoder, for example, some components may use a larger quantization width (e.g., to process those messages where reducing the quantization width too much results in significant degradation of decoding performance) while other components may use a smaller quantization width (e.g., to process those other messages where the smaller quantization width does not result in any performance loss). Advantageously, some embodiments improve the tradeoff between hardware complexity and RBER performance, and enable the efficient use of NB-LDPC codes to provide better frame error rate (FER) performance.

A floating-point TEMS decoder may provide acceptable FER versus RBER performance, but with unacceptable hardware complexity. A conventional fixed-point decoder may uniformly quantize all the messages with the same quantization width (e.g., 6 bits, 7 bits, 8 bits, etc.), with more bits providing a better approximation of the floating-point decoder performance at the cost of higher hardware complexity. For example, the performance of a conventional fixed-point decoder with uniform 8 bits of quantization may be very close to the floating-point decoder. However, when the quantization of the conventional fixed-point decoder is reduced to 7 bits or 6 bits, there is a significant loss in the RBER correction.

Advantageously, some embodiments quantize messages in various decoding stages with different precisions, and selectively truncate least significant bits (LSBs) rather than MSBs, to approximate the performance of a floating-point decoder with components that have just 5- and 6-bit quantization widths for some messages (e.g., more critical messages), while using only 4-bit quantization widths for other messages.

Without being limited to theory of operation, the significant loss in the RBER performance when the quantization width is uniformly reduced at all the messages may occur because messages in certain stages of the decoder have higher dynamic range and hence require or benefit from more bits for their representation, while other messages have smaller dynamic range. Some embodiments may identify the messages that have higher dynamic range and allocate more bits to those messages to improve RBER performance. Similarly, some embodiments identify messages that have lower dynamic range and allocate fewer bits to those messages to reduce hardware complexity. When moving messages between different components with different precisions, some embodiments identify whether to truncate the MSBs, LSBs, or a combination of MSBs and LSBs.

Figure 4:
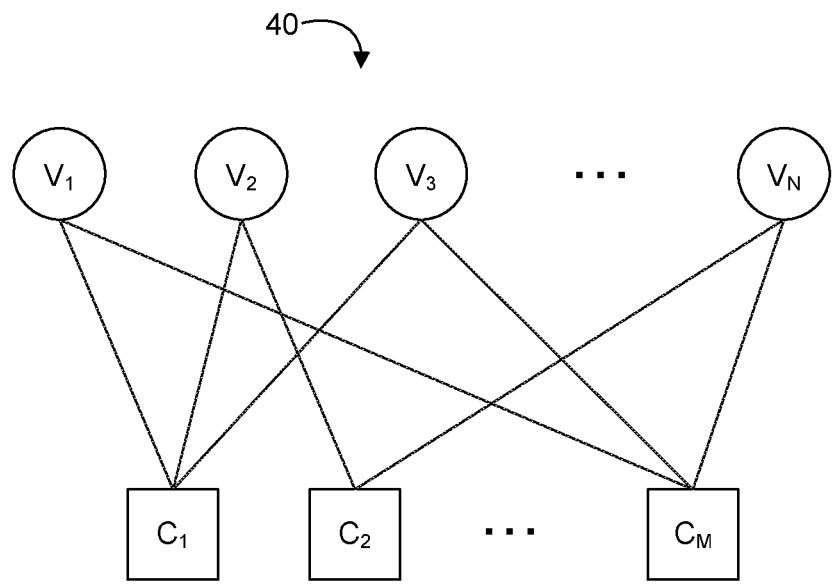
FIG. 4 is a block diagram of an example of a Tanner graph according to an embodiment.

In iterative message passing decoders (e.g., such as belief propagation, TEMS, etc.), LDR messages are sent back and forth between CNs and variable nodes VNs in a Tanner graph arrangement. With reference to FIG. 4, an embodiment of a Tanner graph 40 includes a plurality of variable nodes $V_1$ through $V_N$ interconnected with a plurality of check nodes $C_1$ through $C_M$, where N and M are both positive integers and N is not necessarily the same as M. The lines between the variables nodes and the check nodes are referred to as edges of the Tanner graph 40.

In an example implementation, for a given edge in the Tanner graph of the NB-LDPC code between VNi and CNj, $Upc^{in}[i,j]$ corresponds to the v2c message input to the check node operator (output from VNi) and $Vpv^{out}[i,j]$ corresponds to the output message from the check node operator that is fed back to VNi. For a particular iteration of the decoder, $Upc^{in}[i,j]$ is calculated by summing together the channel information, C[i], and all the incoming c2v messages from all the check nodes connected to VNi from the previous iteration, and then removing the self-message $Vpv^{out}[i,j]$. The sum message at VNi be denoted by S[i]. This implementation may be represented in equation form as follows:

$$S[i][\beta] = \Sigma_{CN\ t\ connected\ to\ VN\ i} Vpv^{out}[i,j][\beta] + C[i][\beta] \text{ for all } \beta \in GF(q) \quad [\text{Eq. 1}]$$

$$Upc^{in}[i,j][\beta] = S[i][\beta] - Vpv^{out}[i,j][\beta] \text{ for all } \beta \in GF(q) \quad [\text{Eq. 2}]$$

where β corresponds to an element of the Galois field GF(q).

Due to the sum operation, S[i] has a significantly higher dynamic range compared to other variables. Some embodiments allocate a higher number of bits (e.g., 8 bits) to this variable (e.g., to reduce the average quantization width but still have performance similar to the uniform 8-bit quantized decoder). The v2c message Upc[i,j] has lower dynamic range than S[i], but has a higher dynamic range compared to Vpv[i,j] (e.g., as described in further detail below). Some embodiments allocate one (1) extra bit to $Upc^{in}[i,j]$ compared to $Vpv^{out}[i,j]$ in a hybrid decoder. Note that the message S[i] is a transient message used in the computation of the variable node output message Upc[i,j], and having 8-bits allocated to S[i] comes at a relatively small hardware cost.

In a TEMS decoder, the check node internal operations for the calculation of $Vpv^{out}[i,j]$ using the incoming v2c messages $Upc^{in}[i,j]$ starts by first converting the v2c messages into a delta domain (e.g., sometimes also referred to as a difference domain) governed by the following equation (where $\beta p^{(0)}$ is the GF(q) index corresponding to the maximum LDR in $Upc^{in}[i,j]$):

$$\Delta Upc^{in}[i,j][\eta] = Upc^{in}[i,j][\beta_p^{(0)}] - Upc^{in}[i,j][\beta p^{(0)} + \eta] \text{ for all } \eta \in GF(q) \quad [\text{Eq. 3}]$$

The further computations involved in the check node processing happen entirely in the delta domain and the output $Vpv^{out}[i,j]$ is calculated from the delta domain messages. After the v2c messages are converted into the delta domain, the dynamic range of the messages involved is lowered. Also, because of the way $\Delta Upc^{in}[i,j]$ is calculated, as well as the intermediate processing in the check node of the TEMS decoder, all of the internal check node processing variables are positive, thus eliminating the need for a sign bit. Accordingly, in some embodiments of a hybrid decoder, only 4 bits (of magnitude) are allocated to the CN internal variables. Because the majority of the complexity in an ImprovedTEMS decoder may be due to the check node operation, embodiments that allocate 4 bits to the CN internal variables advantageously provide a significant complexity reduction with little performance degradation.

The output of the check node operation, $Vpv^{out}[i,j]$, however is not in the delta domain and requires a sign bit. Also, because the output $Vpv^{out}[i,j]$ is calculated from delta domain messages, $Vpv^{out}[i,j]$ has a lower dynamic range requirement compared to the v2c messages $Upc^{in}[i,j]$. Some embodiments allocate one less bit to $Vpv^{out}[i,j]$ compared to $Upc^{in}[i,j]$ in a hybrid decoder.

The computation accuracy of the $\Delta Upc^{in}[i,j]$ calculation depends on a relatively precise calculation of $\beta p^{(0)}$ which is the GF(q) index corresponding to the maximum LDR in $Upc^{in}[i,j]$. Because the most signification bits of $Upc^{in}[i,j]$ are more important for a relatively accurate calculation of $\beta p^{(0)}$, and to further reduce the width of $Upc^{in}[i,j]$ from 8 bits to 6 bits (which is the quantization width of S[i]), some embodiments right shift $Upc^{in}[i,j]$ by one position and truncate the resulting message to +/−31, losing one MSB and one LSB. To ensure the correctness of the TEMS decoder (because the v2c messages are randomly divided into half), some embodiments left shift $Vpv^{out}[i,j]$ by one position.

Some embodiments allocate 6 bits or 5 bits to the channel information C[i] determined by the likelihood levels.

Figure 5:
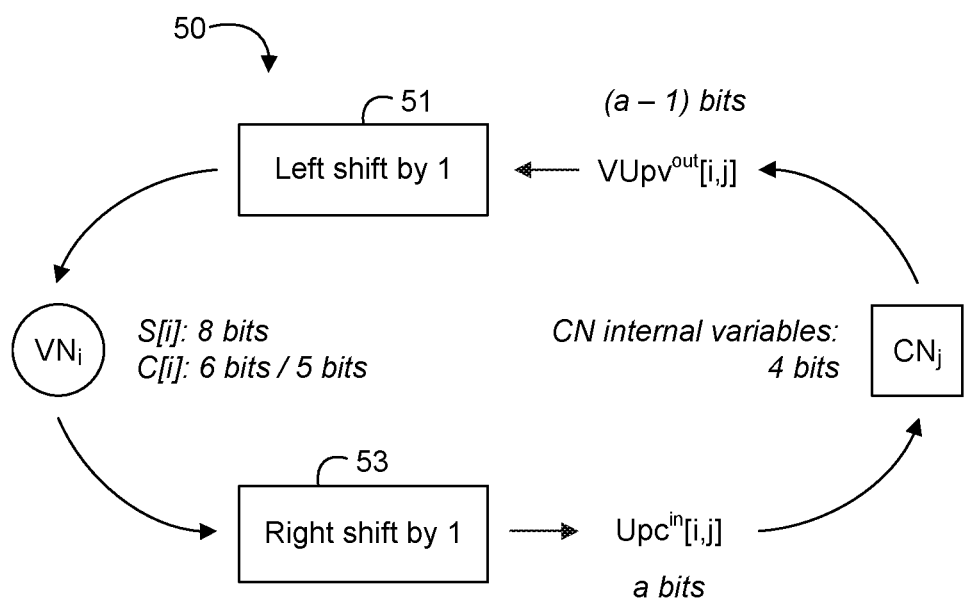
FIG. 5 is a block diagram of an example of a hybrid decoder according to an embodiment.

With reference to FIG. 5, and embodiment of a hybrid decoder 50 may include one or more variable nodes VNi, one or more check nodes CNj, a left shifter 51, and a right shifter 53, coupled as shown. The hybrid decoder 50 may be configured as a Hybrid-(a,a−1) bits decoder (where a=6, 5) that has the properties indicated in Table 1 as follows:

TABLE 1

| Variable | Number of bits |
| --- | --- |
| v2c message | a bits |
| c2v message | a−1 bits |
| S[i] | 8 bits |
| C[i] | 6 bits or 5 bits |
| CN internal variables | 4 bits |

Similar to the structure of a Hybrid-(a,a−1) bits decoder, in a Hybrid-Atmost-a bits decoder (where a=6,5,4) the v2c message still has a bits but a bits are allocated to the c2v messages instead of (a−1) bits in Hybrid-(a,a−1) decoder. In this case, two options of appropriate locations for the left and right shift operations include: 1) right shift $Upc^{in}[i,j]$ by 1 and left shift $Vpv^{out}[i,j]$ by 1, similar to the Hybri-(a,a−1) decoder; and 2) right shift $Upc^{in}[i,j]$ by 2 and left shift $Vpv^{out}[i,j]$ by 1 and left shift $\Delta Upc^{in}[i,j]$ by 1 during delta domain conversion as follows:

$$\Delta Upc^{in}[i,j][\eta] = (Upc^{in}[i,j][\beta p^{(0)}] - Upc^{in}[i,j][\beta p^{(0)} + \eta]) \ll 1 \text{ for all } \eta \in GF(q) \quad [\text{Eq. 4}]$$

Option 2 allows the use of a higher input LDR level and results in a better performance than option 1 and some embodiments adopt option 2 for a Hybrid-Atmost-5 bits and a Hybrid-Atmost-4 bits decoder. For a Hybrid-Atmost-6 bits decoder, option 1 may be preferred. Note that, even after the left shift of $\Delta Upc^{in}[i,j]$ by 1, 4 bits (of magnitude and no sign bit) are still used for $\Delta Upc^{in}[i,j]$ and all other CN internal computation variables.

Figure 6:
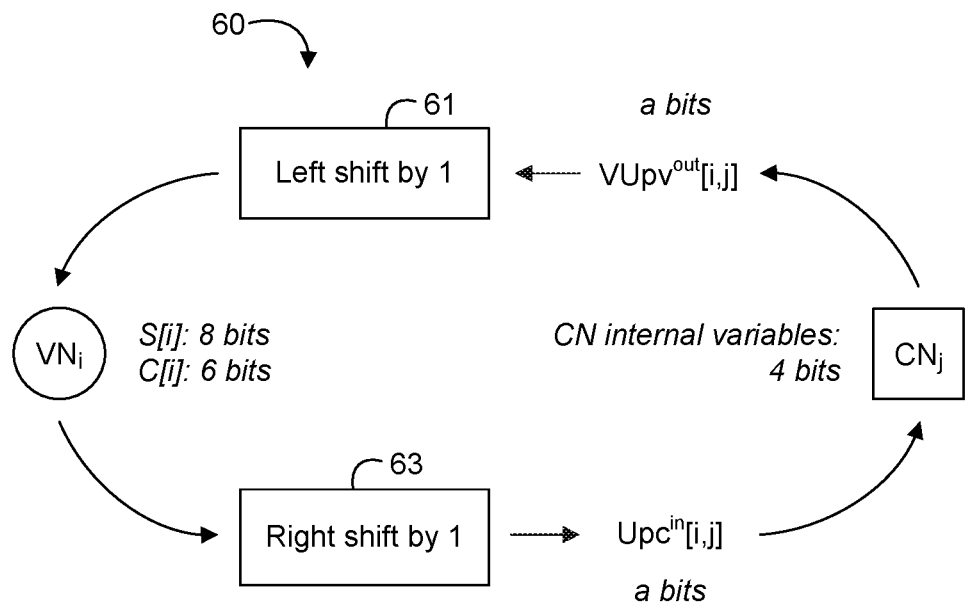
FIG. 6 is a block diagram of another example of a hybrid decoder according to an embodiment.

With reference to FIG. 6, and embodiment of a hybrid decoder 60 may include one or more variable nodes VNi, one or more check nodes CNj, a left shifter 61, and a right shifter 63, coupled as shown. The hybrid decoder 60 may be configured as a Hybrid-Atmost-a bits decoder (where a=5, 4) that has the properties indicated in Table 2 as follows:

TABLE 2

| Variable | Number of bits |
| --- | --- |
| v2c message | a bits |
| c2v message | a bits |
| S[i] | 8 bits |
| C[i] | 6 bits or 5 bits |
| CN internal variables | 4 bits |

Figure 7:
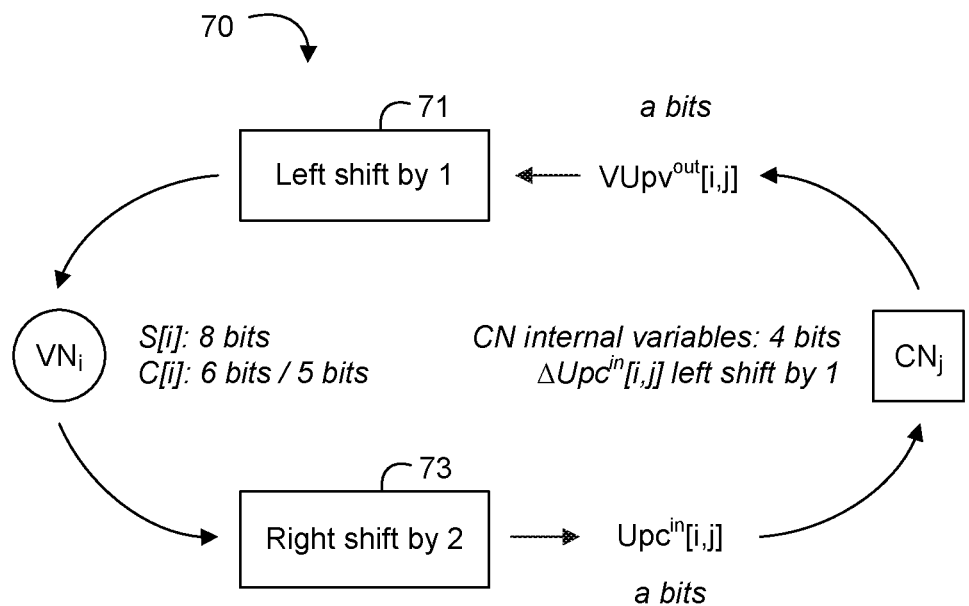
FIG. 7 is a block diagram of another example of a hybrid decoder according to an embodiment.

With reference to FIG. 7, and embodiment of a hybrid decoder 70 may include one or more variable nodes VNi, one or more check nodes CNj, a left shifter 71, and a right shifter 73, coupled as shown. The hybrid decoder 70 may be configured as a Hybrid-Atmost-a bits decoder (where a=6) that has the properties indicated in Table 3 as follows:

TABLE 3

| Variable | Number of bits |
| --- | --- |
| v2c message | a bits |
| c2v message | a bits |

TABLE 3-continued

| Variable | Number of bits |
|---|---|
| S[i] | 8 bits |
| C[i] | 6 bits or 5 bits |
| CN internal variables | 4 bits |

Advantageously, the RBER performance of embodiments of a Hybrid-Atmost-6 bits and Hybrid-(6,5) bits decoder may be very close to a uniform 8-bit quantized decoder, with substantially less hardware complexity. The performance of embodiments of a Hybrid-Atmost-5 bits and Hybrid-(5,4) bits decoder may be significantly better than a uniform 6-bit quantized decoder, with substantially less hardware complexity. Accordingly, embodiments of a hybrid decoder with mixed precision components may provide a better tradeoff between hardware complexity and RBER performance as compared to conventional uniform precision decoders.

Figure 8:
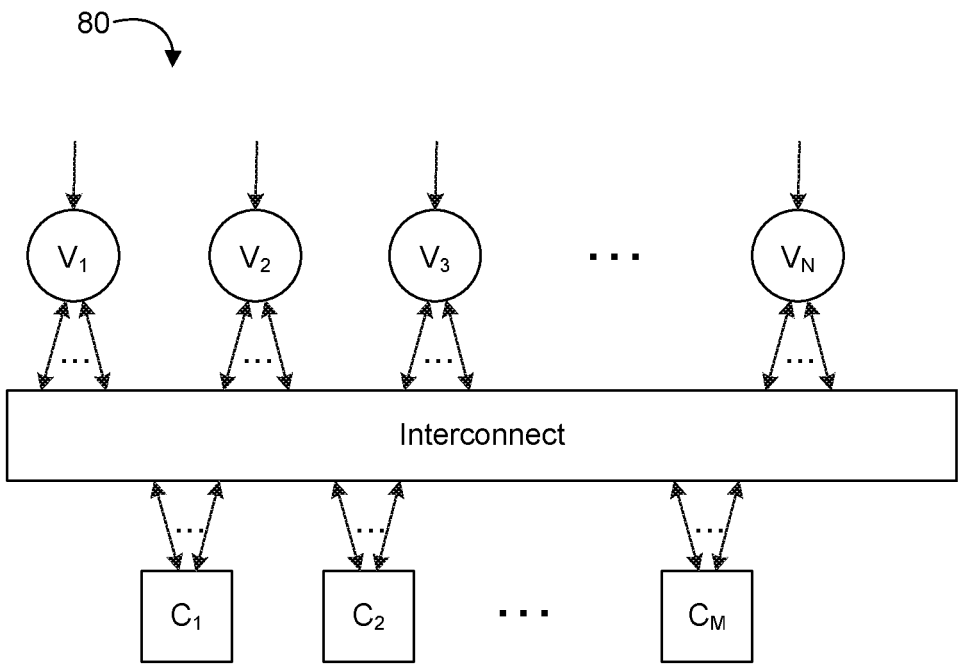
FIG. 8 is a block diagram of another example of a hybrid decoder according to an embodiment.
Figure 9:
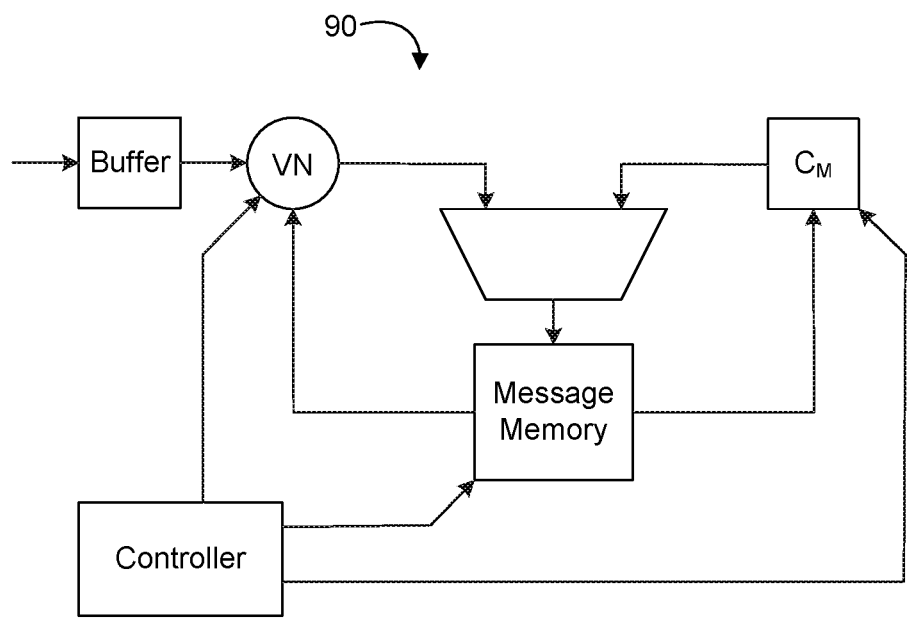
FIG. 9 is a block diagram of another example of a hybrid decoder according to an embodiment.
Figure 10:
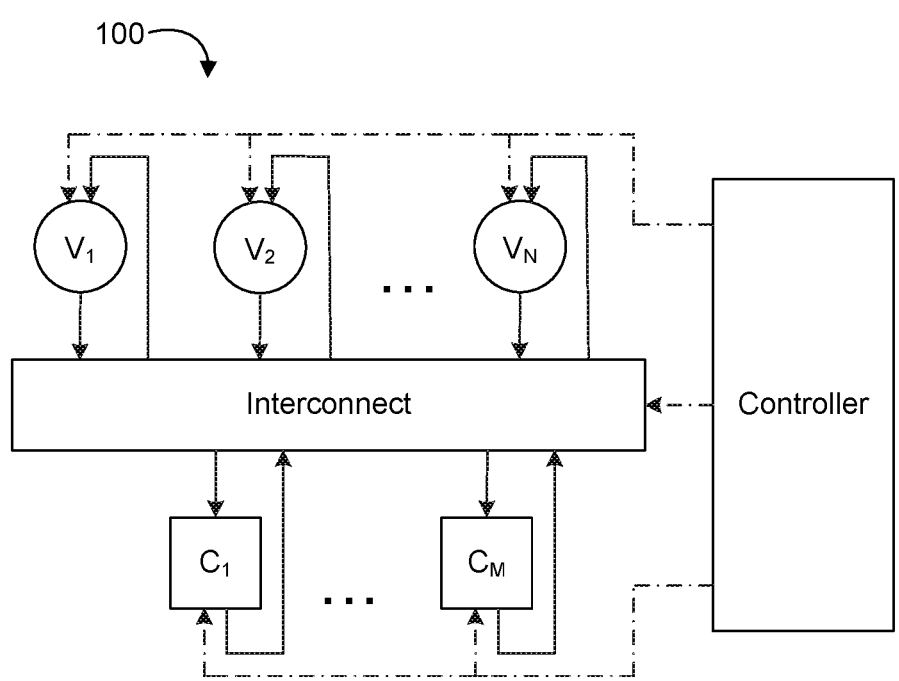
FIG. 10 is a block diagram of another example of a hybrid decoder according to an embodiment.

Any suitable architecture of a NB-LDPC decoder may be utilized with the hybrid decoder technology described herein. Non-limiting example architectures include a highly parallel NB-LDPC hybrid decoder 80 (FIG. 8), a highly serial NB-LDPC hybrid decoder 90 (FIG. 9), and a partially parallel, layered NB-LDPC hybrid decoder 100 (FIG. 10). The hybrid decoders 80, 90, and 100 each include one or more CNs (Ci, i=1 . . . M) and VNs (Vj, j=1 . . . N), together with various memory, interconnect, and/or control elements coupled as illustrated. The computational architecture may resemble or be adapted to the structure of a Tanner graph. The CNs and VNs themselves may be processing elements (e.g., execution units) including shift logic, and the memory, interconnects, and control units may be configured to support exchange of messages between graph nodes.

In the highly parallel hybrid decoder 80 (FIG. 8), all or most nodes of the Tanner graph are separate processing elements that may be served concurrently. The interconnect is configured to provide each CN to VN edge in the Tanner graph. At each iteration, each VN receives an LDR from the channel, together with a number of c2v messages, arriving from a set of CNs. Generated v2c messages are sent back to the CNs. The two-phase decoding technique for NB-LDPC codes splits each iteration in two separated, non-overlapped parts where 1) the VNs receive input messages from the CNs and compute new messages to be sent back to CNs; and 2) the CNs receive messages from the VNs and generate new messages forwarded to VNs. In accordance with some embodiments, the hybrid decoder 80 may be configured to implement one or more of the features described herein, including features of the hybrid decoders 50 (FIG. 5), 60 (FIG. 6) and/or 70 (FIG. 7). For example, the VNs and the CNs of the hybrid decoder 80 may be configured to perform the sum-stage with a first fixed quantization width (e.g., 8 bits), and perform the min-stage in the delta domain with a second fixed quantization width (e.g., 4 bits) that is less than the first fixed quantization width. In some embodiments, the hybrid decoder 80 is configured to allocate a first number of bits to v2c messages that is greater than a second number of bits allocated to c2v messages. For example, the hybrid decoder 80 may be configured to pad c2v messages to fit the first number of bits and to truncate v2c message to fit the second number of bits and preserve the most significant bits (MSBs) of the v2c messages. In some embodiments, the hybrid decoder 80 may include left and right shift logic to pad and truncate the messages, respectively, which may be incorporated in the processing elements for the CNs and/or VNs.

In the highly serial hybrid decoder 90 (FIG. 9), the controller may be the only processing element, or the VN unit and CN unit may also be processing elements, and the nodes of the Tanner graph are served based on time multiplexing. As illustrated in FIG. 9, the hybrid decoder 90 includes a controller, a single CN element, a single VN element, a buffer, and a message memory. After LDRs of a frame are loaded into the buffer, the controller orchestrates the decoding to complete a first half of the iteration (e.g., VN to CN), where the VN reads from the message memory, performs a message computation, and writes the computed messages back to the message memory. The controller then orchestrates the decoding to complete a second half of the iteration (e.g., CN to VN), where the CN reads from the message memory, performs a message computation, and writes the computed messages back to the message memory. In some implementations, the indices i and j may not directly address the message memory. Instead, the controller may include an address generator to store and retrieve the messages to/from the message memory. In accordance with some embodiments, the hybrid decoder 90 may be configured to implement one or more of the features described herein, including features of the hybrid decoders 50 (FIG. 5), 60 (FIG. 6) and/or 70 (FIG. 7). For example, the controller, the VN, and/or the CN of the hybrid decoder 90 may be configured to perform the sum-stage with a first fixed quantization width (e.g., 8 bits), and perform the min-stage in the delta domain with a second fixed quantization width (e.g., 4 bits) that is less than the first fixed quantization width. In some embodiments, the hybrid decoder 90 is configured to allocate a first number of bits to v2c messages that is greater than a second number of bits allocated to c2v messages. For example, the hybrid decoder 90 may be configured to pad c2v messages to fit the first number of bits and to truncate v2c message to fit the second number of bits and preserve the most significant bits (MSBs) of the v2c messages. In some embodiments, the hybrid decoder 90 may include left and right shift logic to pad and truncate the messages, respectively, which may be incorporated in the processing elements for the CNs and/or VNs.

In the partially parallel hybrid decoder 100, a number of the VNs and CNs may be separate processing elements, the number of processing elements is less than the number of nodes in the Tanner graph. Accordingly, multiple nodes share a VN/CN and the controller multiplexes a portion of the decoding operation. The partially parallel hybrid decoder 100 provides different cost/throughput trade-offs, depending on the number of processing elements and the complexity of the interconnect. Permutation networks with acceptable complexity can be used to support VN/CN communication for multiple LDPC codes. The interconnect may be configured to support the desired complexity from a fully flexible network (e.g., capable of supporting any parity check matrix) to lower complexity structures (e.g., for a specific class of codes). Examples of fully flexible solutions include Benes networks, application-specific networks on chip (NoCs), etc. In accordance with some embodiments, the hybrid decoder 100 may be configured to implement one or more of the features described herein, including features of the hybrid decoders 50 (FIG. 5), 60 (FIG. 6) and/or 70 (FIG. 7). For example, the controller, the VNs, and/or the CNs of the hybrid decoder 100 may be configured to perform the sum-stage with a first fixed quantization width (e.g., 8 bits), and perform the min-stage in the delta domain with a second fixed quantization width (e.g., 4 bits) that is less than the first fixed quantization width. In some embodiments, the hybrid decoder 100 is configured to allocate a first number of bits to v2c messages that is greater than a second number of bits allocated to c2v messages. For example, the hybrid decoder 100 may be configured to pad c2v messages to fit the first number of bits and to truncate v2c message to fit the second number of bits and preserve the most significant bits (MSBs) of the v2c messages. In some embodiments, the hybrid decoder 100 may include left and right shift logic to pad and truncate the messages, respectively, which may be incorporated in the processing elements for the CNs and/or VNs.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 11:
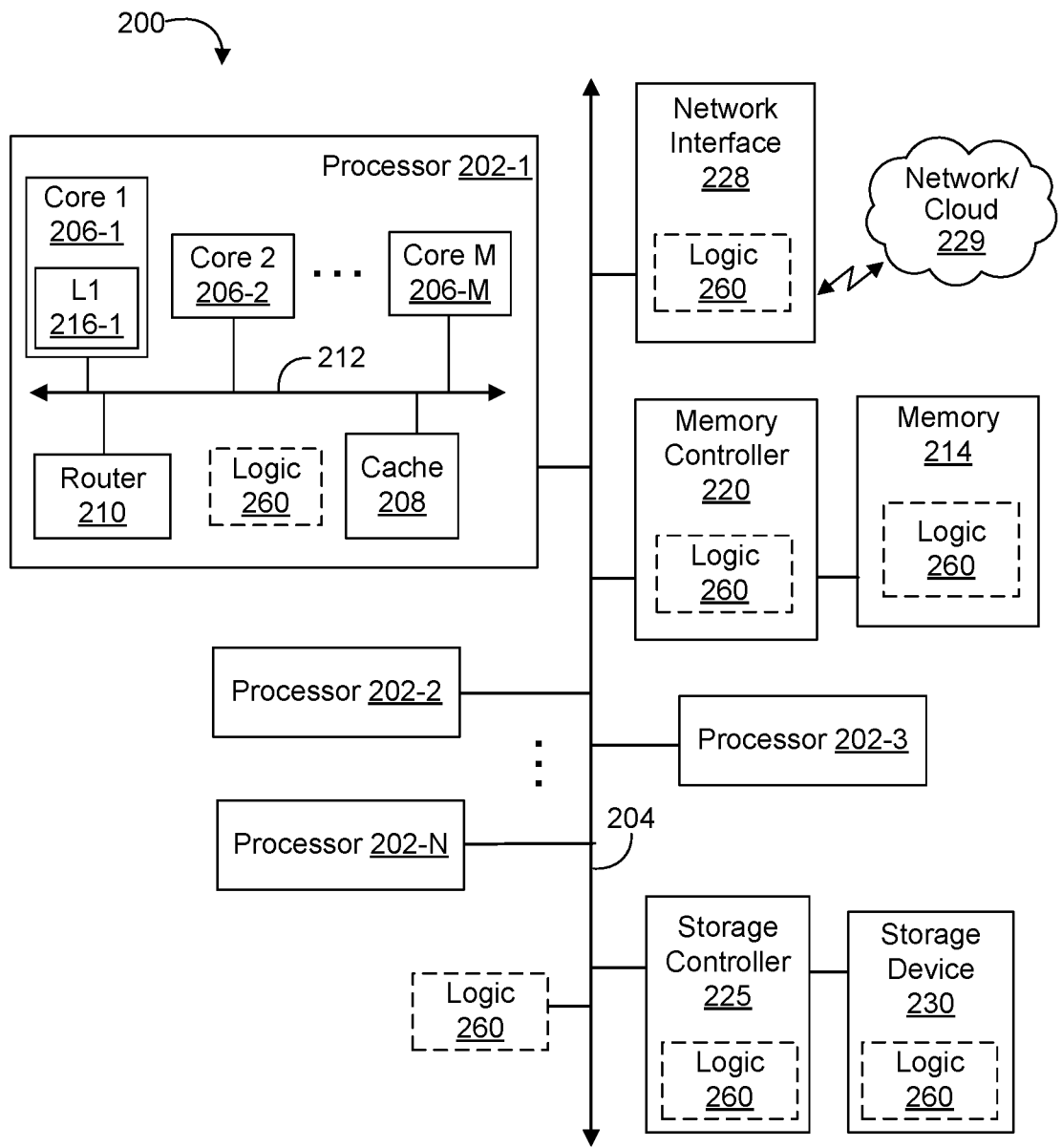
FIG. 11 is a block diagram of an example of a computing system according to an embodiment.

Turning now to FIG. 11, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), logic 260, memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 11, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 11, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 11, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, logic 260, etc., to sense variations in various factors affecting power/thermal behavior of the system/platform, such as temperature, operating frequency, operating voltage, power consumption, and/or inter-core communication activity, etc.

As shown in FIG. 11, features or aspects of the logic 260 may be distributed throughout the system 200, and/or co-located/integrated with various components of the system 200. Any aspect of the system 200 that may require or benefit from error correction technology may include the logic 260. For example, the processor(s) 202, the memory 214, the memory controller 220, the storage controller 225, and the network interface 228 may each include logic 260, which may be in the same enclosure as the system 200 and/or fully integrated on a printed circuit board (PCB) of the system 200. Advantageously, the logic 260 may include technology to implement one or more aspects of the system 10 (FIG. 1), the apparatus 15 (FIG. 2), the method 20 (FIG. 3), the Tanner graph 40 (FIG. 4), the hybrid decoder 50 (FIG. 5), the hybrid decoder 60 (FIG. 6), the hybrid decoder 70 (FIG. 7), the hybrid decoder 80 (FIG. 8), the hybrid decoder 90 (FIG. 9), the hybrid decoder 100 (FIG. 10), and/or any of the dynamic self-correction features discussed herein. The system 200 may include further logic 260 and located outside of the foregoing components.

In some embodiments, the logic 260 may be configured to perform a first decode stage with a first fixed quantization width, and perform a second decode stage with a second fixed quantization width that is different from the first fixed quantization width. For example, the first decode stage may correspond to a sum-stage of a decoder, the second decode stage may correspond to a min-stage in a delta domain of the decoder, and the first fixed quantization width may be greater than the second fixed quantization width.

In some embodiments, the logic 260 may be further configured to iteratively pass messages back and forth between check nodes and variable nodes, where a first number of bits allocated to messages sent from a variable node to a check node is greater than a second number of bits allocated to messages sent from a check node to a variable node. For example, the logic 260 may be configured to pad messages sent from the check nodes to the variable nodes to fit the first number of bits. In some embodiments, the logic 260 may be configured to perform a left shift to pad the messages sent from the check node to the variable node and preserve the MSBs of the messages. The logic 260 may also be configured to truncate messages sent from the variable nodes to the check nodes to fit the second number of bits. For example, the logic 260 may be configured to perform a right shift to truncate the messages sent from the variable nodes to the check nodes and preserve the MSBs of the message.

Additional Notes and Examples

Example 1 includes an electronic apparatus, comprising one or more substrates, and a decoder coupled to the one or more substrates, the decoder including logic to perform a first decode stage with a first fixed quantization width, and perform a second decode stage with a second fixed quantization width that is different from the first fixed quantization width.

Example 2 includes the apparatus of Example 1, wherein the first decode stage corresponds to a sum-stage of the decoder, the second decode stage corresponds to a min-stage in a delta domain of the decoder, and the first fixed quantization width is greater than the second fixed quantization width.

Example 3 includes the apparatus of any of Examples 1 to 2, wherein the logic is further to iteratively pass messages back and forth between check nodes and variable nodes, wherein a first number of bits allocated to messages sent from a variable node to a check node is greater than a second number of bits allocated to messages sent from a check node to a variable node.

Example 4 includes the apparatus of Example 3, wherein the logic is further to pad messages sent from the check nodes to the variable nodes to fit the first number of bits.

Example 5 includes the apparatus of Example 4, wherein the logic is further to perform a left shift to pad the messages sent from the check node to the variable node and preserve the most significant bits of the messages.

Example 6 includes the apparatus of any of Examples 3 to 5, wherein the logic is further to truncate messages sent from the variable nodes to the check nodes to fit the second number of bits.

Example 7 includes the apparatus of Example 6, wherein the logic is further to perform a right shift to truncate the messages sent from the variable nodes to the check nodes and preserve the most significant bits of the message.

Example 8 includes an electronic system, comprising a controller, memory, and a decoder communicatively coupled to the controller and the memory, the decoder including logic to perform a first decode stage with a first fixed quantization width, and perform a second decode stage with a second fixed quantization width that is different from the first fixed quantization width.

Example 9 includes the system of Example 8, wherein the first decode stage corresponds to a sum-stage of the decoder, the second decode stage corresponds to a min-stage in a delta domain of the decoder, and the first fixed quantization width is greater than the second fixed quantization width.

Example 10 includes the system of any of Examples 8 to 9, wherein the logic is further to iteratively pass messages back and forth between check nodes and variable nodes, wherein a first number of bits allocated to messages sent from a variable node to a check node is greater than a second number of bits allocated to messages sent from a check node to a variable node.

Example 11 includes the system of Example 10, wherein the logic is further to pad messages sent from the check nodes to the variable nodes to fit the first number of bits.

Example 12 includes the system of Example 11, wherein the logic is further to perform a left shift to pad the messages sent from the check node to the variable node and preserve the most significant bits of the messages.

Example 13 includes the system of any of Examples 10 to 12, wherein the logic is further to truncate messages sent from the variable nodes to the check nodes to fit the second number of bits.

Example 14 includes the system of Example 13, wherein the logic is further to perform a right shift to truncate the messages sent from the variable nodes to the check nodes and preserve the most significant bits of the message.

Example 15 includes a method of decoding parity information, comprising performing a first decode stage of a decoder with a first fixed quantization width, and performing a second decode stage of the decoder with a second fixed quantization width that is different from the first fixed quantization width.

Example 16 includes the method of Example 15, wherein the first decode stage corresponds to a sum-stage of the decoder, the second decode stage corresponds to a min-stage in a delta domain of the decoder, and the first fixed quantization width is greater than the second fixed quantization width.

Example 17 includes the method of any of Examples 15 to 16, further comprising iteratively passing messages back and forth between check nodes and variable nodes, wherein a first number of bits allocated to messages sent from a variable node to a check node is greater than a second number of bits allocated to messages sent from a check node to a variable node.

Example 18 includes the method of Example 17, further comprising padding messages sent from the check nodes to the variable nodes to fit the first number of bits.

Example 19 includes the method of Example 18, further comprising performing a left shift to pad the messages sent from the check node to the variable node and preserve the most significant bits of the messages.

Example 20 includes the method of any of Examples 17 to 19, further comprising truncating messages sent from the variable nodes to the check nodes to fit the second number of bits.

Example 21 includes the method of Example 20, further comprising performing a right shift to truncate the messages sent from the variable nodes to the check nodes and preserve the most significant bits of the message.

Example 22 includes at least one non-transitory machine readable medium comprising a plurality of instructions that, in response to being executed on a computing device, cause the computing device to perform a first decode stage of a decoder with a first fixed quantization width, and perform a second decode stage of the decoder with a second fixed quantization width that is different from the first fixed quantization width.

Example 23 includes the at least one non-transitory machine readable medium of Example 22, wherein the first decode stage corresponds to a sum-stage of the decoder, the second decode stage corresponds to a min-stage in a delta domain of the decoder, and the first fixed quantization width is greater than the second fixed quantization width.

Example 24 includes the at least one non-transitory machine readable medium of any of Examples 22 to 23, comprising a plurality of further instructions that, in response to being executed on the computing device, cause the computing device to iteratively pass messages back and forth between check nodes and variable nodes, wherein a first number of bits allocated to messages sent from a variable node to a check node is greater than a second number of bits allocated to messages sent from a check node to a variable node.

Example 25 includes the at least one non-transitory machine readable medium of Example 24, comprising a plurality of further instructions that, in response to being executed on the computing device, cause the computing device to pad messages sent from the check nodes to the variable nodes to fit the first number of bits.

Example 26 includes the at least one non-transitory machine readable medium of Example 25, comprising a plurality of further instructions that, in response to being executed on the computing device, cause the computing device to perform a left shift to pad the messages sent from the check node to the variable node and preserve the most significant bits of the messages.

Example 27 includes the at least one non-transitory machine readable medium of any of Examples 24 to 26, comprising a plurality of further instructions that, in response to being executed on the computing device, cause the computing device to truncate messages sent from the variable nodes to the check nodes to fit the second number of bits.

Example 28 includes the at least one non-transitory machine readable medium of Example 27, comprising a plurality of further instructions that, in response to being executed on the computing device, cause the computing device to perform a right shift to truncate the messages sent from the variable nodes to the check nodes and preserve the most significant bits of the message.

Example 29 includes a decoder apparatus, comprising means for performing a first decode stage of a decoder with a first fixed quantization width, and means for performing a second decode stage of the decoder with a second fixed quantization width that is different from the first fixed quantization width.

Example 30 includes the apparatus of Example 29, wherein the first decode stage corresponds to a sum-stage of the decoder, the second decode stage corresponds to a min-stage in a delta domain of the decoder, and the first fixed quantization width is greater than the second fixed quantization width.

Example 31 includes the apparatus of any of Examples 29 to 30, further comprising means for iteratively passing messages back and forth between check nodes and variable nodes, wherein a first number of bits allocated to messages sent from a variable node to a check node is greater than a second number of bits allocated to messages sent from a check node to a variable node.

Example 32 includes the apparatus of Example 31, further comprising means for padding messages sent from the check nodes to the variable nodes to fit the first number of bits.

Example 33 includes the apparatus of Example 32, further comprising means for performing a left shift to pad the messages sent from the check node to the variable node and preserve the most significant bits of the messages.

Example 34 includes the apparatus of any of Examples 31 to 33, further comprising means for truncating messages sent from the variable nodes to the check nodes to fit the second number of bits.

Example 35 includes the apparatus of Example 34, further comprising means for performing a right shift to truncate the messages sent from the variable nodes to the check nodes and preserve the most significant bits of the message.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   one or more substrates; and
   a decoder coupled to the one or more substrates, the decoder including circuitry to:
   provide a plurality of nodes of a bipartite graph, the plurality of nodes comprising variable nodes and check nodes;
   calculate a sum value, during a sum-stage, based on first messages which are communicated each from a respective one of the check nodes to a respective one of the variable nodes; and
   calculate a difference value, during a min-stage, based on a second message which is communicated from a respective one of the variable nodes to a respective one of the check nodes;
   wherein:
   the second message is based on the sum value; and
   a first fixed quantization width of the sum value is greater than a second fixed quantization width of the difference value.

2. The electronic apparatus of claim 1, wherein the circuitry is further to:
   iteratively pass messages back and forth between the check nodes and the variable nodes, wherein a first number of bits allocated to messages sent from a variable node to a check node is greater than a second number of bits allocated to messages sent from the check node to the variable node.

3. The electronic apparatus of claim 2, wherein the circuitry is further to:
   pad messages sent from the check nodes to the variable nodes to fit the first number of bits.

4. The electronic apparatus of claim 3, wherein the circuitry is further to:
   perform a left shift to pad the messages sent from the check node to the variable node and preserve the most significant bits of the messages.

5. The electronic apparatus of claim 2, wherein the circuitry is further to:
   truncate messages sent from the variable nodes to the check nodes to fit the second number of bits.

6. The electronic apparatus of claim 5, wherein the circuitry is further to:
   perform a right shift to truncate the messages sent from the variable nodes to the check nodes and preserve the respective most significant bits of the messages.

7. An electronic system, comprising:
   a controller;
   memory; and
   a decoder communicatively coupled to the controller and the memory, the decoder including circuitry to:
   provide a plurality of nodes of a bipartite graph, the plurality of nodes comprising variable nodes and check nodes;

calculate a sum value, during a sum-stage, based on first messages which are communicated each from a respective one of the check nodes to a respective one of the variable nodes; and calculate a difference value, during a min-stage, based on a second message which is communicated from a respective one of the variable nodes to a respective one of the check nodes;

wherein:

the second message is based on the sum value; and a first fixed quantization width of the sum value is greater than a second fixed quantization width of the difference value.

8. The electronic system of claim 7, wherein the circuitry is further to:

iteratively pass messages back and forth between the check nodes and the variable nodes, wherein a first number of bits allocated to messages sent from a variable node to a check node is greater than a second number of bits allocated to messages sent from the check node to the variable node.

9. The electronic system of claim 8, wherein the circuitry is further to:

pad messages sent from the check nodes to the variable nodes to fit the first number of bits.

10. The electronic system of claim 9, wherein the circuitry is further to:

perform a left shift to pad the messages sent from the check node to the variable node and preserve the most significant bits of the messages.

11. The electronic system of claim 8, wherein the circuitry is further to:

truncate messages sent from the variable nodes to the check nodes to fit the second number of bits.

12. The electronic system of claim 11, wherein the circuitry is further to:

perform a right shift to truncate the messages sent from the variable nodes to the check nodes and preserve the respective most significant bits of the messages.

13. A method of decoding parity information, the method comprising:

calculating a sum value, during a sum-stage, based on first messages which are communicated each from a respective one of check nodes of a decoder circuit to a respective one of variable nodes of the decoder circuit; and calculating a difference value, during a min-stage, based on a second message which is communicated from a respective one of the variable nodes to a respective one of the check nodes; wherein:

the second message is based on the sum value; and a first fixed quantization width of the sum value is greater than a second fixed quantization width of the difference value.

14. The method of claim 13, further comprising:

iteratively passing messages back and forth between the check nodes and the variable nodes, wherein a first number of bits allocated to messages sent from a variable node to a check node is greater than a second number of bits allocated to messages sent from the check node to the variable node.

15. The method of claim 14, further comprising:

padding messages sent from the check nodes to the variable nodes to fit the first number of bits.

16. The method of claim 15, further comprising:

performing a left shift to pad the messages sent from the check node to the variable node and preserve the most significant bits of the messages.

17. The method of claim 14, further comprising:

truncating messages sent from the variable nodes to the check nodes to fit the second number of bits.

* * * * *